United States Patent
Soeta et al.

(10) Patent No.: US 11,028,498 B2
(45) Date of Patent: Jun. 8, 2021

(54) SINGLE CRYSTAL PULLING APPARATUS INCLUDING A DOPANT SUPPLYING MEANS HAVING A TUBE WITH A PLURALITY OF BLOWING PORTS

(71) Applicant: SHIN-ETSU HANDOTAI CO., LTD., Tokyo (JP)

(72) Inventors: Satoshi Soeta, Fukui (JP); Kazuya Nakagawa, Sabae (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 16/340,529

(22) PCT Filed: Sep. 19, 2017

(86) PCT No.: PCT/JP2017/033749
§ 371 (c)(1),
(2) Date: Apr. 9, 2019

(87) PCT Pub. No.: WO2018/083899
PCT Pub. Date: May 11, 2018

(65) Prior Publication Data
US 2020/0048789 A1    Feb. 13, 2020

(30) Foreign Application Priority Data
Nov. 1, 2016 (JP) .............................. JP2016-214691

(51) Int. Cl.
*C30B 15/04* (2006.01)
*C30B 29/06* (2006.01)

(52) U.S. Cl.
CPC .............. *C30B 15/04* (2013.01); *C30B 29/06* (2013.01)

(58) Field of Classification Search
CPC ......... C30B 29/00; C30B 29/02; C30B 29/06; C30B 15/00; C30B 15/02; C30B 15/04;
(Continued)

(56) References Cited

U.S. PATENT DOCUMENTS

2010/0175612 A1 * 7/2010 Narushima ............. C30B 29/06
117/19
2010/0294999 A1    11/2010 Narushima et al.

FOREIGN PATENT DOCUMENTS

CN    103184514 A       7/2013
CN    105369345 A   *   3/2016
(Continued)

OTHER PUBLICATIONS

May 7, 2019 International Preliminary Report on Patentability issued in International Patent Application No. PCT/JP2017/033749.
(Continued)

*Primary Examiner* — Kenneth A Bratland, Jr.
(74) *Attorney, Agent, or Firm* — Oliff PLC

(57) ABSTRACT

A single crystal pulling apparatus including a dopant supplying means which includes: a charging device provided outside a chamber for storing a dopant and charging the dopant into the chamber; a sublimation room provided inside the chamber for holding and sublimating the dopant charged from the charging device; a carrier gas-introducing device for introducing a carrier gas into the sublimation room; and a blowing device for blowing the dopant sublimated in the sublimation room together with the carrier gas onto a surface of a raw-material melt. The blowing device includes a tube connected to the sublimation room and blowing ports such that the sublimated dopant is scattered from the blowing ports via the tube and blown onto the surface of the raw-material melt. This provides a single
(Continued)

crystal pulling apparatus capable of efficient doping with a sublimable dopant within the shortest possible time.

10 Claims, 4 Drawing Sheets

(58) Field of Classification Search
CPC ...... C30B 15/20; Y10T 117/00; Y10T 117/10; Y10T 117/1024; Y10T 117/1032; Y10T 117/1056
USPC ....... 117/11, 13, 19, 21, 200, 206, 208, 214, 117/928, 931, 932
See application file for complete search history.

(56) References Cited

FOREIGN PATENT DOCUMENTS

| CN | 105369346 | A |   | 3/2016 |
| JP | 2001-342094 | A |   | 12/2001 |
| JP | 2003115459 | A | * | 4/2003 |
| JP | 2008-266093 | A |   | 11/2008 |
| JP | 2011-132043 | A |   | 7/2011 |
| JP | 2011132043 | A | * | 7/2011 |
| JP | 2013-129551 | A |   | 7/2013 |

OTHER PUBLICATIONS

Dec. 3, 2019 Office Action issued in Japanese Patent Application No. 2016-214691.

Nov. 21, 2017 Search Report issued in International Patent Application No. PCT/JP2017/033749.

Jul. 20, 2020 Office Action issued in Chinese Patent Application No. 201780067855.8.

* cited by examiner

[FIG. 1]
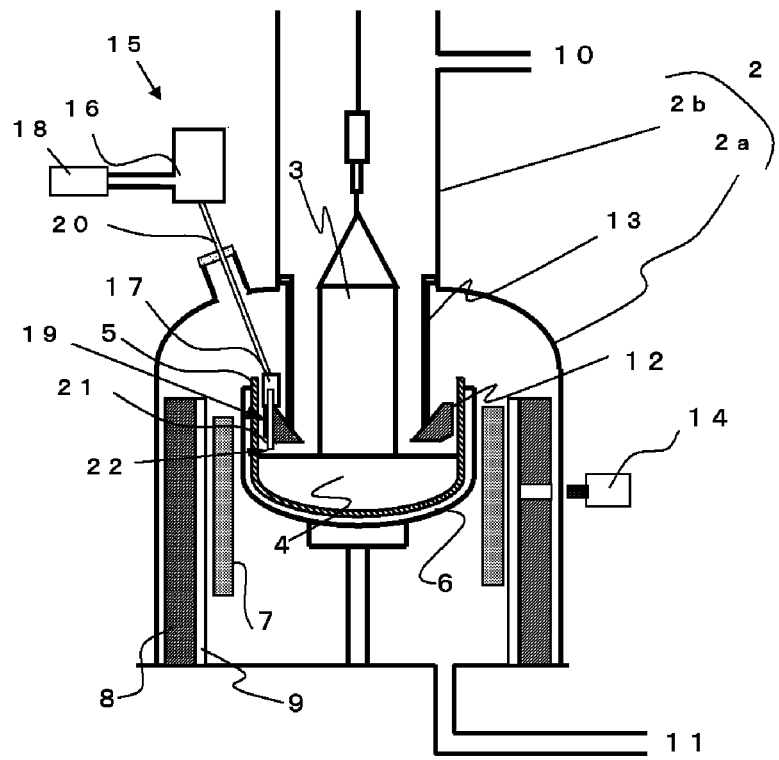
[FIG. 2A]
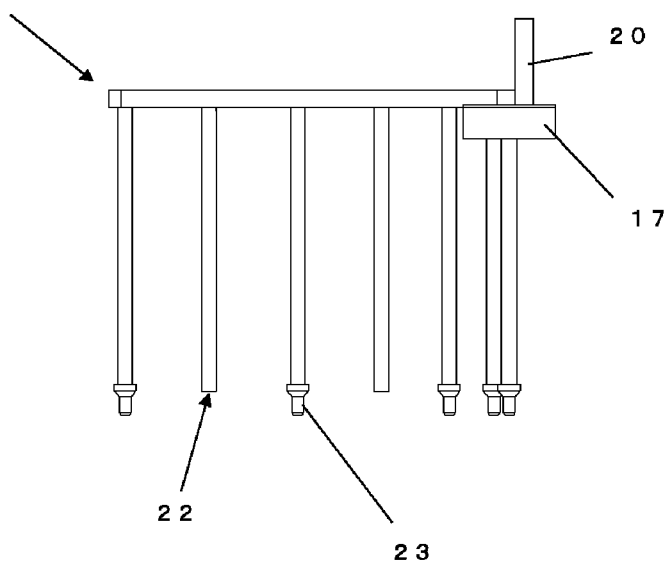

[FIG. 2B]
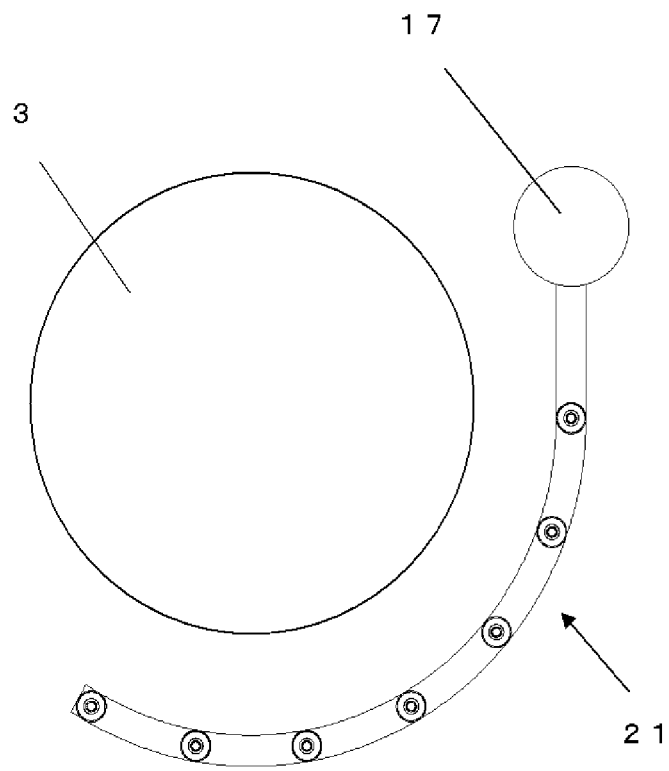
[FIG. 3]
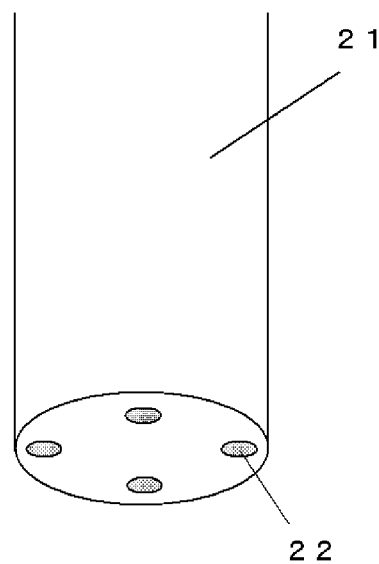

[FIG. 4]
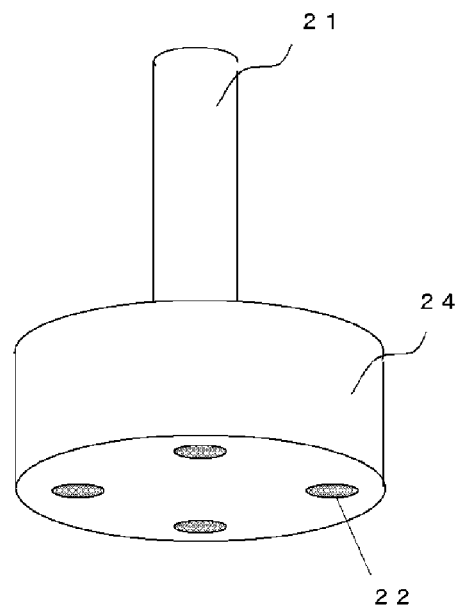
[FIG. 5]
(RELATED ART)
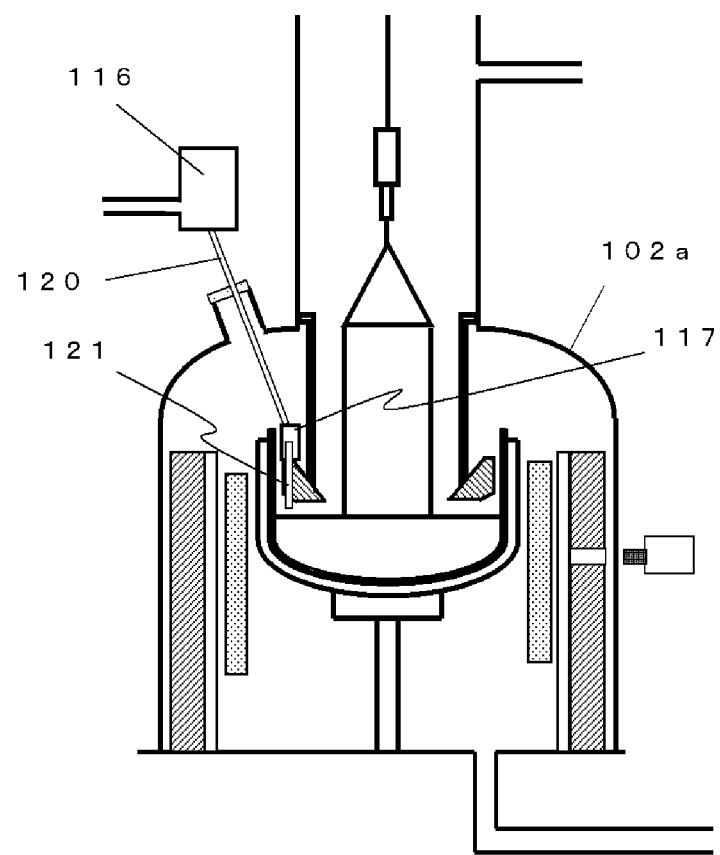

[FIG. 6]
(RELATED ART)
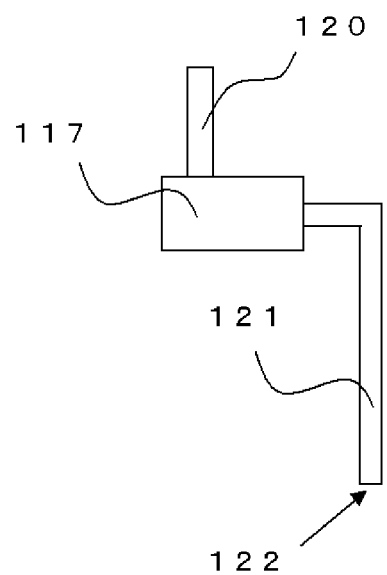

SINGLE CRYSTAL PULLING APPARATUS INCLUDING A DOPANT SUPPLYING MEANS HAVING A TUBE WITH A PLURALITY OF BLOWING PORTS

TECHNICAL FIELD

The present invention relates to a single crystal pulling apparatus for pulling a silicon single crystal from a raw-material melt in a crucible according to a Czochralski method.

BACKGROUND ART

The demand for N-type low-resistivity substrates dedicated to low-breakdown-voltage power devices has been increasing more and more.

As a method for manufacturing single crystals of multiple specifications in a distinctive way, there is a method called AB cut in which two single crystals are pulled by at first pulling a product X with high resistivity, and then recharging a dopant into the remaining melt (raw-material melt) to pull a product Y with low resistivity.

For more efficient manufacturing, there is a method for pulling one piece of a single crystal in which the product X with high target resistivity is produced from the TOP side of the crystal by using initially charged phosphorus, and the product Y with low resistivity is produced by using a dopant recharged in the halfway point of pulling the straight body. The faster the doping rate in the halfway point of the method, the smaller the loss.

Meanwhile, when only a crystal with low resistivity is to be produced, the melt before the pulling is charged with a lot of dopant. However, such a large amount of the dopant causes a problem that a dislocation is likely to occur in the cone step of single crystal growth. The reason is considered as follows. Specifically, in the initial stage of the cone step, the gas linear velocity is slow between the melt surface and the shield for cutting radiant heat from a heater and the melt located over the melt surface; consequently, the evaporated dopant and its oxide adhere to the crystal.

Further, since N-type dopants are volatile, there is another problem that when such an N-type dopant is charged before seeding, a portion thereof is evaporated before the pulling step of the straight body, which serves as a product.

Against these problems, a halfway doping method is employed in which after the cone step is performed using a melt with a low dopant concentration, the doping is performed while the straight body is pulled (for example, Patent Document 1). In this case also, the faster the halfway doping rate, the smaller the loss.

In the halfway doping, the following method is often employed: heat in a furnace is utilized to sublimate phosphorus and arsenic because of their sublimable nature, and the resultant is passed through a tube and blown to a melt together with a carrier gas for doping.

A HZ (hot zone) structure for halfway doping with phosphorus is as shown in FIG. 5. A red phosphorus-charging device 116 is placed outside a main chamber 102a. The red phosphorus-charging device 116 stores red phosphorus therein, and has such a function to drop red phosphorus at a desired speed by shaking (Patent Document 2). The dropped red phosphorus passes through a linking tube 120, and drops into a sublimation room 117 provided in a furnace. In addition, a carrier gas also flows inside the linking tube 120. Since the sublimation room 117 is at 1000° C. or higher, the dropped red phosphorus sublimates to a gas, which is then passed through a doping tube 121 together with the carrier gas and blown to a melt.

CITATION LIST

Patent Literature

Patent Document 1: Japanese Unexamined Patent publication (Kokai) No. 2008-266093
Patent Document 2: Japanese Unexamined Patent publication (Kokai) No. 2013-129551

SUMMARY OF INVENTION

Technical Problem

The halfway doping as described above is desirably carried out within the shortest possible time.

However, the halfway doping at high speeds increases the concentration at a doped portion of the melt, increasing the evaporation amount in the region. This results in problems that the melt is doped less than expected, and that the evaporated substance adheres to the crystal, causing a dislocation.

The present invention has been made in view of the above-described problems. An object of the present invention is to provide a single crystal pulling apparatus capable of doping with a sublimable dopant such that the doping with the dopant is performed efficiently within the shortest possible time.

Solution to Problem

To achieve the object, the present invention provides a single crystal pulling apparatus comprising:
a heater for heating a raw material in a crucible to thereby form a raw-material melt;
a chamber for housing the heater and the crucible; and
a dopant supplying means for supplying a sublimable dopant to the raw-material melt, and pulling a silicon single crystal from the raw-material melt according to a Czochralski method, wherein
the dopant supplying means comprises:
a charging device provided outside the chamber and configured to store the dopant and charge the dopant into the chamber;
a sublimation room provided inside the chamber and configured to hold and sublimate the dopant charged from the charging device;
a carrier gas-introducing device configured to introduce a carrier gas into the sublimation room; and
a blowing device configured to blow the dopant sublimated in the sublimation room together with the carrier gas from the carrier gas-introducing device onto a surface of the raw-material melt, and
the blowing device comprises a tube connected to the sublimation room and a plurality of blowing ports such that the sublimated dopant is scattered from the plurality of blowing ports via the tube and blown onto the surface of the raw-material melt.

In doping with a sublimable dopant in gas form, such a single crystal pulling apparatus is capable of suppressing localization of the dopant in a raw-material melt. This makes it possible to prevent, unlike conventional pulling apparatuses, an increase of the evaporation amount of the dopant in such a localization region, thereby preventing a dislocation of a pulling crystal due to adhesion of the evaporated substance and the like (evaporated dopant and its oxide) and a failure in the doping into the raw-material melt as expected. Thus, the true doping rate of actually dissolving the dopant into the raw-material melt for incorporation into a crystal can be increased, which enables efficient doping within a short time. Hence, the manufacturing cost can be reduced by reducing the doping loss.

Moreover, the tube of the blowing device can branch into two or more, and one or more orifices opened at each tip of the branches can constitute the plurality of blowing ports.

Meanwhile, a plurality of orifices opened at an end of the tube of the blowing device may constitute the plurality of blowing ports.

Providing such a plurality of blowing ports makes it possible to efficiently prevent the localization of a dopant when the dopant is doped into a raw-material melt.

Alternatively, the blowing device can comprise a detachable adapter at an end of the tube, and a plurality of holes opened at the adapter constitute the plurality of blowing ports.

Such an adapter having a plurality of blowing ports can efficiently prevent the localization of a dopant when the dopant is doped into a raw-material melt.

Further, in the above case, the tube of the blowing device can branch into two or more, and each tip of the branches can comprise the adapter.

Such a structure further prevents the localization of a dopant and enables more efficient doping.

Moreover, the blowing device can comprise a detachable cap configured to block the plurality of blowing ports.

When such a cap is provided, an unnecessary blowing port is capped and blocked depending on, for example, pulling conditions and so forth, so that only necessary blowing ports can be opened for doping. Attaching and detaching the cap(s) enable adjustments of the doping amount and the region where a dopant is blown onto a raw-material melt.

Additionally, the dopant can be phosphorus or arsenic.

These have been conventionally used as sublimable dopants in many cases, and the present invention is suitable for these sublimable dopants.

Advantageous Effects of Invention

As described above, the present invention makes it possible to suppress localization of a sublimable dopant in a raw-material melt at the time of doping with the dopant in a gas form. Thus, an increase in the evaporation amount, dislocation of a pulling crystal due to adhesion of the evaporated substance and the like, and shortage of the doping amount can be prevented, which are caused by the dopant localization. Hence, efficient doping within a short time is possible. As a result, the manufacturing yield of single crystals is improved.

BRIEF DESCRIPTION OF DRAWINGS

FIG. 1 is a schematic view showing an example of a single crystal pulling apparatus of the present invention.

FIG. 2A is a side view showing an example of a blowing device.

FIG. 2B is a top view showing an example of the blowing device.

FIG. 3 is a schematic view showing another example of the blowing device.

FIG. 4 is a schematic view showing another example of the blowing device.

FIG. 5 is a schematic view showing an example of a conventional single crystal pulling apparatus.

FIG. 6 is a schematic view showing an example of a conventional blowing device.

DESCRIPTION OF EMBODIMENTS

Hereinafter, embodiments of the present invention will be described with reference to the drawings. However, the present invention is not limited thereto.

FIG. 1 shows an example of a single crystal pulling apparatus of the present invention operated according to a Czochralski method. This single crystal pulling apparatus 1 has a chamber 2 (including a main chamber 2a and a pulling chamber 2b). The inside of a quartz crucible 5 in a graphite crucible 6 disposed in the main chamber 2a is filled with a silicon melt (raw-material melt) 4. A silicon single crystal 3 is pulled from this raw-material melt 4 inside the pulling chamber 2b. A heater 7 for heating the raw-material melt 4 is installed around the graphite crucible 6. A heat-insulating member 8 and a graphite shield 9 for insulating the heat from the heater 7 are installed around the heater 7.

An inert gas such as argon is introduced from a gas inlet 10 to fill the single crystal pulling apparatus 1. The gas flows along a gas flow-guide cylinder 13 and is exhausted from a gas outlet 11. Moreover, on the raw-material melt 4 side of the gas flow-guide cylinder 13, a heat-shielding member 12 is installed to shield the radiation from the heater 7 and the raw-material melt 4.

Further, a radiation thermometer 14 is installed outside the single crystal pulling apparatus 1, and a part of the heat-insulating member 8 is removed at this position to allow the temperature measurement of the graphite shield 9.

Furthermore, a dopant supplying means 15 is for supplying the raw-material melt 4 with a sublimable dopant (also simply referred to as dopant) during single crystal growth. The dopant supplying means 15 includes a charging device 16, a sublimation room 17, a carrier gas-introducing device 18, and a blowing device 19.

The charging device 16 is provided outside the chamber 2, includes a linking tube 20, and is linked to the sublimation room 17 provided inside the chamber 2. Moreover, the charging device 16 is a device configured to store a dopant and charge the dopant into the sublimation room 17 via the linking tube 20. It is enough for the charging device 16 to have a mechanism capable of appropriately adjusting the charging amount of the dopant stored therein. For example, such a mechanism may utilize shaking to charge a dopant at a predetermined speed.

The dopant is not particularly limited, as long as it is sublimable and can dope a raw-material melt in a gas form. Examples thereof include phosphorus and arsenic, which are conventionally used.

The sublimation room 17 is a room configured to hold the dopant charged from the charging device 16. The sublimation room 17 is also a room provided inside the chamber 2 and configured to sublimate the held sublimable dopant with the heat of the atmosphere in the chamber 2. The arrangement of the sublimation room 17 inside the chamber 2 can be determined as appropriate for efficient sublimation.

Moreover, the sublimation room 17 is linked to the carrier gas-introducing device 18 also via the linking tube 20. The carrier gas-introducing device 18 is configured to introduce a carrier gas such as, for example, argon into the sublimation room 17 via the linking tube 20. Together with the sublimated dopant, the carrier gas introduced into the sublimation room 17 reaches a surface of the raw-material melt by the blowing device 19.

The flow amount of the carrier gas to be introduced is desirably a flow amount required for the sublimated dopant to reach the raw-material melt 4, but is within such a range that the raw-material melt 4 does not fluctuate to such an extent as to hinder the single crystal growth as a result of blowing the dopant.

Further, the blowing device 19 is configured to blow the sublimated dopant and the carrier gas from the sublimation room 17 onto the surface of the raw-material melt. In the present invention, this blowing device 19 includes a tube (note that, herein, doping tube 21) connected to the sublimation room 17 and a plurality of blowing ports 22.

Hereinafter, embodiments of this blowing device 19 (the doping tube 21 and the plurality of blowing ports 22) will be described below in detail, but are not limited thereto.

First Embodiment

FIG. 2A and FIG. 2B respectively show examples of the blowing device. FIG. 2A is a side view, and FIG. 2B is a top view thereof.

The doping tube 21 branches into two or more. Here, the description is given of a case where the doping tube 21 branches into seven as an example. Nevertheless, the number of branches is not limited, and can be determined as appropriate in accordance with a desired doping rate and so forth. In other words, the upper limit of the number of branches cannot be limited because it depends on desired conditions. Nonetheless, the larger the number of branches, the more complex the structure. Hence, the number of branches is preferably ten or less.

Additionally, one orifice is opened at each tip of the branches of the doping tube 21. From this orifice, the dopant from the sublimation room 17 is blown together with the carrier gas onto the surface of the raw-material melt. Specifically, these orifices play a role of the blowing ports 22. Since the dopant is blown from the orifices at the tips of the multiple branches, the dopant can be blown and scattered onto the surface of the raw-material melt.

The branched doping tube 21 can be annularly disposed so as to surround the periphery of the pulled silicon single crystal 3 as shown in FIG. 2B, for example. Here, an example is shown in which the doping tube 21 is disposed within a range of approximately ⅓ of the periphery of the silicon single crystal 3. However, the arrangement is not limited thereto, and the doping tube 21 may be disposed to surround the entire periphery.

Meanwhile, the configuration of a conventional apparatus, for example, as shown in FIG. 6 includes only one doping tube 121 which has no branch, and one blowing port 122. Hence, the dopant is blown and concentrated at one region on the surface of the raw-material melt. In such a conventional apparatus, the dopant is localized, so that the evaporation amount of the dopant is increased. Then, the evaporated dopant and its oxide are elevated and adhere to the crystal during the pulling, causing a dislocation. Moreover, since the evaporation amount is large, the single crystal is not doped with a predetermined amount.

In contrast, in the inventive single crystal pulling apparatus 1, the plurality of blowing ports 22 are particularly formed in the blowing device 19 as described above, which makes it possible to prevent the dopant from being blown and concentrated at one spot on the surface of the raw-material melt, and to suppress the localization of the dopant in the raw-material melt. Thereby, conventional problems such as dislocation of a pulling crystal and insufficient doping can be suppressed. The true doping rate of actually dissolving the dopant into the raw-material melt can be increased, enabling quite efficient doping within a short time in comparison with the conventional apparatus. Consequently, the manufacturing cost can be reduced in comparison with the conventional apparatus.

As described above, utilizing the branches of the doping tube 21 as shown in FIGS. 2A and 2B can surely easily and efficiently prevent the localization of a dopant.

Note that, as can be seen from FIG. 2A, the orifices (blowing ports 22) at the tips may be provided with a detachable cap 23 capable of blocking the orifices.

In the example shown in FIG. 2A, among the orifices opened at the tips of the seven branches of the doping tube 21, five orifices are blocked by the caps 23, and two orifices are opened. When a silicon single crystal is actually pulled and doped with a gas, it is enough for two or more among the seven orifices to be opened. Attaching and detaching the caps 23 enable adjustments of the doping amount and dopant-blown region. The attachment and detachment of the caps 23 can be determined at will in accordance with various conditions, and can be utilized as the adjustment means for doping conditions.

Second Embodiment

FIG. 3 shows another example of the blowing device. In this example, there is just one doping tube 21 with no branch, but a plurality of orifices (the blowing ports 22) are opened at an end of the doping tube 21. Forming a plurality of such small orifices also makes it possible to blow and scatter a dopant, thus preventing the localization of the dopant. In this case, the blowing ports 22 may be provided at not only the end but also a side surface of the doping tube 21.

Note that it is also possible to combine the first embodiment and the second embodiment. Specifically, although the example shown in FIGS. 2A and 2B is described such that just one orifice is opened at each tip of the seven branches of the doping tube 21, a plurality of orifices may be opened. Thereby, the dopant can also be blown onto the surface of the raw-material melt in such a manner that the dopant is scattered by the seven branches of the doping tube 21 and further scattered from the plurality of orifices at each tip of the branches. As a result, it is possible to further prevent the localization, and evenly incorporate the dopant into the raw-material melt. The maximum number of the orifices per tip cannot be particularly limited, and can be determined as appropriate in accordance with desired conditions. Nonetheless, if the number of orifices is large, it is necessary to design the doping tube 21 having a larger thickness. Hence, the number of the orifices is preferably ten or less.

Third Embodiment

FIG. 4 shows another example of the blowing device. In this example, an adapter 24 is detachably attached to the end of the doping tube 21. The adapter 24 has a plurality of holes opened therein, and these constitute the plurality of blowing ports 22. The shape of the adapter 24, the number of the holes, and so forth can be determined at will. It is enough that these enable the attachment to the doping tube 21, and enable the dopant to be scattered from the plurality of blowing ports 22 and blown onto the surface of the raw-material melt.

Further, it is possible to combine the first embodiment and the third embodiment so that the doping tube 21 may branch into multiple, and each tip of the branches may be equipped with the adapter 24.

In addition, in the third embodiment also, the aforementioned cap 23 can be detachably attached. The cap 23 can be attached and detached as necessary. When the silicon single crystal 3 is manufactured, it is enough for the plurality of blowing ports 22 to be opened to blow and scatter the dopant.

EXAMPLE

Hereinafter, the present invention will be specifically described with reference to Examples and Comparative Example. However, the present invention is not limited thereto.

Examples 1, 2, Comparative Example

The inventive single crystal pulling apparatus and the conventional single crystal pulling apparatus were prepared. Silicon single crystals were pulled while being doped with gases at various doping rates. More specifically, two kinds of the blowing devices were prepared: the conventional device shown in FIGS. 5 and 6 (device A) (Comparative Example) in which the doping tube is not branched and a raw-material melt is doped at one spot; and the inventive device shown in FIGS. 2A and 2B (device B) (Examples 1, 2) in which the doping tube is branched into seven. Single crystals were pulled with each apparatus.

Note that, in the device B, the doping tube was annularly disposed so as to surround the single crystal to be pulled. Moreover, ends of the tube of the device B can be equipped with caps, and the orifices can also be blocked therewith.

Polycrystalline silicon was introduced into each quartz crucible, and the raw material was melted and charged with a dopant, followed by seeding.

Since an N-type low resistivity crystal is susceptible to dislocation in the cone step, careful attention needs to be paid in the manufacturing. If a cone is too obtuse, a facet of (111) is formed and a dislocation occurs at the position. For this reason, the speed at which a cone is formed is decreased in comparison with a normal crystal to thereby form a longer cone.

In this event, if excessively longer cone is formed, it takes a much longer time. Thus, the dopant evaporates in a much larger amount.

As the initial doping, the initial doping was performed in advance to be 1.25 mΩcm at a straight body of 0 cm. In the halfway point of the straight-body step, the halfway doping (doping with a phosphorus gas) was performed in a predetermined section. After a crystal reached a given length, the tail step was performed, followed by the after-heating step. The single crystal was cooled and then taken out.

If a crystal was dislocated in a halfway point of the above process, the crystal was re-melted. Phosphorus in an amount estimated to be evaporated during this extra operation time was directly charged into the raw-material melt for doping. Then, the seeding step was performed again.

Herein, the doping rate under the minimum condition is expressed as a speed of 1.0. When a crystal was successfully DF (dislocation free), the doping rate was gradually increased followed by pulling out.

In the device A as Comparative Example, the carrier gas for the halfway doping was set at 1.5 L/min. The carrier gas was continued to flow even when the halfway doping was not performed. When the doping rate was from 1.0 to 3.0, the crystal was pulled out in DF. When the doping rate was 3.0, the doped section was 50 cm and the resistivity after the doping was 0.87 mΩcm.

Further, when the doping rate was 4.0, the crystals were always dislocated even in several trials.

In the device B as Example 1, seven spots were opened and trials were started from the doping rate of 6.0. Although the carrier gas for the halfway doping was initially 3.0 L/min, the resistivity was not decreased. Specifically, since the raw-material melt was not sufficiently doped with phosphorus, the carrier gas was set at 5.0 L/min in the end. If the carrier gas flows too much, a foreign matter is likely to reach the crystal, causing a dislocation; meanwhile, if the flow amount is too small, phosphorus is hindered by an Ar gas in the main, so that the raw-material melt is less doped with phosphorus. Thus, the balance is important. As a result, when the doping rate was 6.0 and 9.0, the crystal was DF. In these cases, the doped section was 30 cm and the resistivity was 0.86 mΩcm.

Incidentally, when the doping rate was 12.0, the crystals were dislocated in all of several trials.

The device B was also evaluated as Example 2 in which five spots were blocked and only two spots were opened. When the doping rate was 5.0, the crystal was DF. In this event, the carrier gas was 3.0 L/min, the doped section was 40 cm, and the resistivity after the doping was 0.88 mΩ cm.

When the doping rate was 6.0, the crystals were always dislocated even in several trials.

The pulled crystals were each cylindrically ground, and samples were cut from predetermined positions for resistivity measurement. The measured resistivity was compared with values in the calculation program to calculate a transfer percentage which indicates what % of phosphorus used in the halfway doping was dissolved into the raw-material melt.

In the calculation program, the material balance of phosphorus at a 10-minute interval had been calculated. Specifically, the content obtained by subtracting phosphorus in the crystal newly manufactured and evaporated phosphorus in the 10-minute section is phosphorus left in the raw-material melt. With respect to the halfway-doping section, the phosphorus added in the halfway doping is the phosphorus left in the raw-material melt, and the phosphorus left in the raw-material melt is a result of the multiplication by the transfer percentage.

From the profile of the phosphorus concentration in the crystal, the profile of the resistivity is obtained, and it is a function of the transfer percentage. By fitting with the actually measured resistivity, the transfer percentage can be calculated.

Table 1 summarized relations of the doping rate, success or failure of single crystallization, transfer percentage, and true doping rate (doping rate×transfer percentage) thus obtained for each device.

TABLE 1

| | | Doping rate | | | | | | | |
|---|---|---|---|---|---|---|---|---|---|
| | | 1 | 2 | 3 | 4 | 5 | 6 | 9 | 12 |
| (Comparative Example) Device A | single crystallization | OK | OK | OK | NG | | | | |
| | transfer percentage | 40% | 40% | 35% | | | | | |
| | true doping rate | 0.4 | 0.8 | 1.1 | | | | | |
| (Example 2) Device B: 2 spots | single crystallization | | | | | OK | NG | | |
| | transfer percentage | | | | | 35% | | | |
| | true doping rate | | | | | 1.75 | | | |
| (Example 1) Device B: 7 spots | single crystallization | | | | | | OK | OK | NG |
| | transfer percentage | | | | | | 35% | 30% | |
| | true doping rate | | | | | | 2.1 | 2.7 | |

As can also be seen from the summary of Table 1, in Comparative Example in which the dopant was blown from only one spot, successful doping without dislocation was achieved only by the doping with the doping rate of 3.0 at most. Additionally, the true doping rate was approximately 1.1.

In contrast, in Example 2 in which the dopant was blown and scattered from two spots, the doping was possible with the doping rate as high as 5.0, and the true doping rate was 1.75. In other words, the doping was performed about 1.6 times as efficiently as Comparative Example.

Further, in Example 1 in which the dopant was blown and scattered from seven spots, the doping was possible with the doping rate as high as 9.0, and the true doping rate was 2.7. In other words, the doping was performed about 2.5 times as efficiently as Comparative Example.

Increasing the true doping rate enables doping within a short time, reduces the loss of crystals, and thus can reduce the manufacturing cost for single crystals.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A single crystal pulling apparatus comprising:
   a heater for heating a raw material in a crucible to thereby form a raw-material melt;
   a chamber for housing the heater and the crucible; and
   a dopant supplying means for supplying a sublimable dopant to the raw-material melt, and pulling a silicon single crystal from the raw-material melt according to a Czochralski method, the dopant supplying means comprising:
      a charging device provided outside the chamber and configured to store the dopant and charge the dopant into the chamber,
      a sublimation room provided inside the chamber and configured to hold and sublimate the dopant charged from the charging device,
      a carrier gas-introducing device configured to introduce a carrier gas into the sublimation room; and
      a blowing device configured to blow the dopant sublimated in the sublimation room together with the carrier gas from the carrier gas-introducing device onto a surface of the raw-material melt, the blowing device comprising a first tube which is different from the sublimation room and connected to the sublimation room, two or more second tubes, and a plurality of blowing ports such that the sublimated dopant is scattered from the plurality of blowing ports via the first tube and the two or more second tubes and blown onto the surface of the raw-material melt,
   wherein the first tube of the blowing device branches into the two or more second tubes, and
   one or more orifices opened at each tip of the two or more second tubes constitute the plurality of blowing ports.

2. The single crystal pulling apparatus according to claim 1, wherein a plurality of orifices opened at tips of the second tubes are the plurality of blowing ports.

3. The single crystal pulling apparatus according to claim 1, wherein each tip of the second tubes comprises a detachable adapter, a plurality of holes opened at the adapter, and the plurality of holes are the plurality of blowing ports.

4. The single crystal pulling apparatus according to claim 1, wherein the blowing device comprises a detachable cap configured to block the plurality of blowing ports.

5. The single crystal pulling apparatus according to claim 2, wherein the blowing device comprises a detachable cap configured to block the plurality of blowing ports.

6. The single crystal pulling apparatus according to claim 3, wherein the blowing device comprises a detachable cap configured to block the plurality of blowing ports.

7. The single crystal pulling apparatus according to claim 1, wherein the dopant is phosphorus or arsenic.

8. The single crystal pulling apparatus according to claim 2, wherein the dopant is phosphorus or arsenic.

9. The single crystal pulling apparatus according to claim 3, wherein the dopant is phosphorus or arsenic.

10. The single crystal pulling apparatus according to claim 4, wherein the dopant is phosphorus or arsenic.

* * * * *